US009088276B2

(12) United States Patent
Liu et al.

(10) Patent No.: US 9,088,276 B2
(45) Date of Patent: Jul. 21, 2015

(54) PRE-EMPHASIS CONTROL CIRCUIT FOR ADJUSTING THE MAGNITUDE OF A SIGNAL OVER A PERIOD ACCORDING TO A FRACTION OF A BIT-TIME (75) Inventors: Sandra Liu, Richmond Hill (CA); Eric W. Hu, New Market (CA); Chih-Tsung Ku, Thornhill (CA)

(73) Assignee: ATI TECHNOLOGIES ULC, Markham (CA)

( * ) Notice: Subject to any disclaimer, the term of this patent is extended or adjusted under 35 U.S.C. 154(b) by 397 days.

(21) Appl. No.: 13/118,634

(22) Filed: May 31, 2011

(65) Prior Publication Data
US 2012/0306893 A1 Dec. 6, 2012

(51) Int. Cl.
G06F 1/00 (2006.01)
H03K 19/00 (2006.01)

(52) U.S. Cl.
CPC .................. H03K 19/0002 (2013.01)

(58) Field of Classification Search
USPC ............ 341/101, 144; 375/285, 296, 295; 326/86, 82; 370/534; 345/87, 214, 501; 713/400, 500; 380/268; 332/109
See application file for complete search history.

(56) References Cited

U.S. PATENT DOCUMENTS

| 6,639,948 | B1 * | 10/2003 | Tager | |
| 6,791,483 | B2 * | 9/2004 | Hattori | |
| 6,897,685 | B2 * | 5/2005 | Sato | 326/86 |
| 7,345,602 | B2 * | 3/2008 | Saeki et al. | |
| 7,868,804 | B2 * | 1/2011 | Khoury et al. | 341/144 |
| 7,903,064 | B2 * | 3/2011 | Shiomi | 345/87 |
| 7,940,839 | B2 | 5/2011 | Lapointe | |
| 7,949,041 | B2 | 5/2011 | Zerbe | |
| 7,961,778 | B2 | 6/2011 | Buckwalter | |
| 7,990,295 | B2 * | 8/2011 | Takada | 341/101 |
| 8,289,049 | B2 * | 10/2012 | Matsushima | 326/82 |
| 8,311,064 | B1 * | 11/2012 | Wu et al. | 370/534 |
| 8,315,303 | B1 * | 11/2012 | Chana et al. | 375/238 |
| 8,466,859 | B1 * | 6/2013 | Herz | 345/87 |
| 2004/0223558 | A1 * | 11/2004 | Brown et al. | 375/296 |
| 2008/0315967 | A1 * | 12/2008 | Ludwig | 332/109 |
| 2010/0303234 | A1 * | 12/2010 | Fuse et al. | 380/268 |
| 2011/0193854 | A1 * | 8/2011 | Lee | 345/214 |
| 2011/0228871 | A1 * | 9/2011 | Lutz | 375/295 |
| 2011/0239031 | A1 * | 9/2011 | Ware et al. | 713/500 |
| 2012/0017107 | A1 * | 1/2012 | Lee | 713/400 |

* cited by examiner

*Primary Examiner* — Thomas Lee
*Assistant Examiner* — Aurel Prifti
(74) *Attorney, Agent, or Firm* — Meyertons Hood Kivlin Kowert & Goetzel; Erik A. Heter (57) ABSTRACT

A pre-emphasis circuit is disclosed. In one embodiment, a pre-emphasis circuit includes a first signal path configured to receive a first signal and a second signal path configured to receive the first signal. The second signal path includes a re-timing circuit configured to delay the first signal by a pre-determined amount to produce a second signal. The pre-emphasis circuit also includes a summing circuit coupled to receive the first signal from the first signal path and the second signal from the second signal path. The summing circuit is configured to add the second signal to the first signal to produce a third signal, wherein the third signal is logically equivalent to the first signal. The third signal has a first magnitude for a first portion of a bit-time of the first signal, and a second magnitude for a second portion of the bit-time of the first signal.

30 Claims, 7 Drawing Sheets

PRE-EMPHASIS CONTROL CIRCUIT FOR ADJUSTING THE MAGNITUDE OF A SIGNAL OVER A PERIOD ACCORDING TO A FRACTION OF A BIT-TIME

BACKGROUND

1. Field of the Invention

This invention relates to electronic circuits, and more particularly, to signaling circuits.

2. Description of the Related Art

In order for a digital system to operate correctly, the information embedded in a transmitted signal must be recoverable by a corresponding receiver. In order to ensure the correct information is recovered by a receiver, various signaling techniques may be utilized. One such signaling technique is known as pre-emphasis. In pre-emphasis, the magnitude of a transmitted signal may be increased relative to a normal magnitude in some cases. For example, in one scheme a signal may be pre-emphasized any time there is a logical transition (logic 0 to logic 1, or vice versa). Pre-emphasis may compensate for distortion of signals resulting from high transmission rates, thereby increasing the likelihood that a received signal more closely matches a corresponding transmitted signal. This may in turn result in fewer bit errors, thereby increasing system reliability.

SUMMARY OF THE DISCLOSURE

A pre-emphasis circuit is disclosed. In one embodiment, a pre-emphasis circuit includes a first signal path configured to receive a first signal and a second signal path configured to receive the first signal. The second signal path includes a re-timing circuit configured to delay the first signal by a pre-determined amount to produce a second signal. The pre-emphasis circuit also includes a summing circuit coupled to receive the first signal from the first signal path and the second signal from the second signal path. The summing circuit is configured to add the second signal to the first signal to produce a third signal, wherein the third signal is logically equivalent to the first signal. The third signal has a first magnitude for a first portion of a bit-time of the first signal, and a second magnitude for a second portion of the bit-time of the first signal.

In one embodiment, a method for pre-emphasizing signals includes providing a first signal to a first signal path and providing the first signal to a second signal path. The method further includes delaying the first signal, by a predetermined amount, in the second signal path in order to generate a second signal. The first and second signals may be added together to produce a third signal, wherein the third signal is logically equivalent to the first signal, and wherein the third signal has a first magnitude for a first portion of a bit-time of the first signal, and a second magnitude for a second portion of the bit-time of the first signal.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Overview

Various embodiments of a method and apparatus for pre-emphasizing signals are disclosed. An apparatus for transmitting signals includes first and second signal paths coupled to receive signals provided by a serializer. A signal (e.g., a digital signal) may be received by both the first and second signal paths. In the second signal path, the signal may be retimed order to produce a second signal. As defined herein, retiming the first signal may include delaying the first signal, inverting the first signal, or any other operation such that the resulting second signal has rising and falling edges that occur at different times with respect to the first signal. The first and second signals may be provided to a summing circuit, where their respective voltage levels are added together to produce a third signal. When the first and second signals have the same logic level, the resulting third signal is a pre-emphasized version of the first signal. When the first and second signals are at different logic levels, the third signal may be a normal (i.e. non-pre-emphasized) version of the first signal. Thus, a pre-emphasized signal as defined herein may be defined as a signal that is transmitted at a first voltage magnitude, while a normal (non-pre-emphasized) signal may be defined as a signal transmitted at a second voltage magnitude that is less than the first.

Pre-emphasis of a signal may occur for all or just a portion of that signal's bit time. As used herein, the term bit-time may be defined as the time a transmitted bit is held at a given logic level before transitioning to the next bit. In various embodiments, a bit-time may correspond to the total period of a clock signal (e.g., from a first rising edge to a next rising edge of the clock signal). The portion of the bit-time for which a signal may be pre-emphasized may be based on the second signal produced by re-timing the first signal. For example, a signal may pre-emphasized for a portion ¼ bit-time, while transmitted at its normal logic level for the remaining portion of ¾ bit-time.

A pre-emphasized signal, logic low or high, may have a first voltage magnitude, while a signal transmitted at the normal logic level may have a second voltage magnitude. The relative voltage magnitudes may be based on a reference voltage. Thus, the voltage magnitude of a pre-emphasized signal (logic high or low) may have a greater potential difference relative to the reference voltage than that of a signal that is not pre-emphasized.

In various embodiments, signals may be pre-emphasized when a logical transition occurs. For example, if a logic low is followed by a logic high (e.g., logic 1 following a logic 0), the logic high may be pre-emphasized. If consecutively transmitted signals have the same logic level or value (e.g., two consecutive logic 1's), the second and subsequent ones of those signals may be transmitted at a normal (i.e. non-pre-emphasized) voltage level.

The method and apparatus for pre-emphasizing signals is discussed below in the context of a graphics subsystem, in which a graphics care may transmit signals to a display unit. However, it is noted that these exemplary embodiments are not intended to be limiting. On the contrary, various embodiments of the method and apparatus for pre-emphasizing signals may be used in any application in which signals are transmitted between a transmitter and receiver. Such applications may include the implementation of an embodiment of the pre-emphasis method and apparatus in an integrated circuit (IC) for intra-chip communications, in an IC for inter-chip communications in a printed circuit assembly. In general, embodiments of the method and apparatus described herein may be implemented in any environment where pre-emphasis of transmitted signals may be useful.

Graphics Subsystem with Graphics Card and Display

Figure 1:
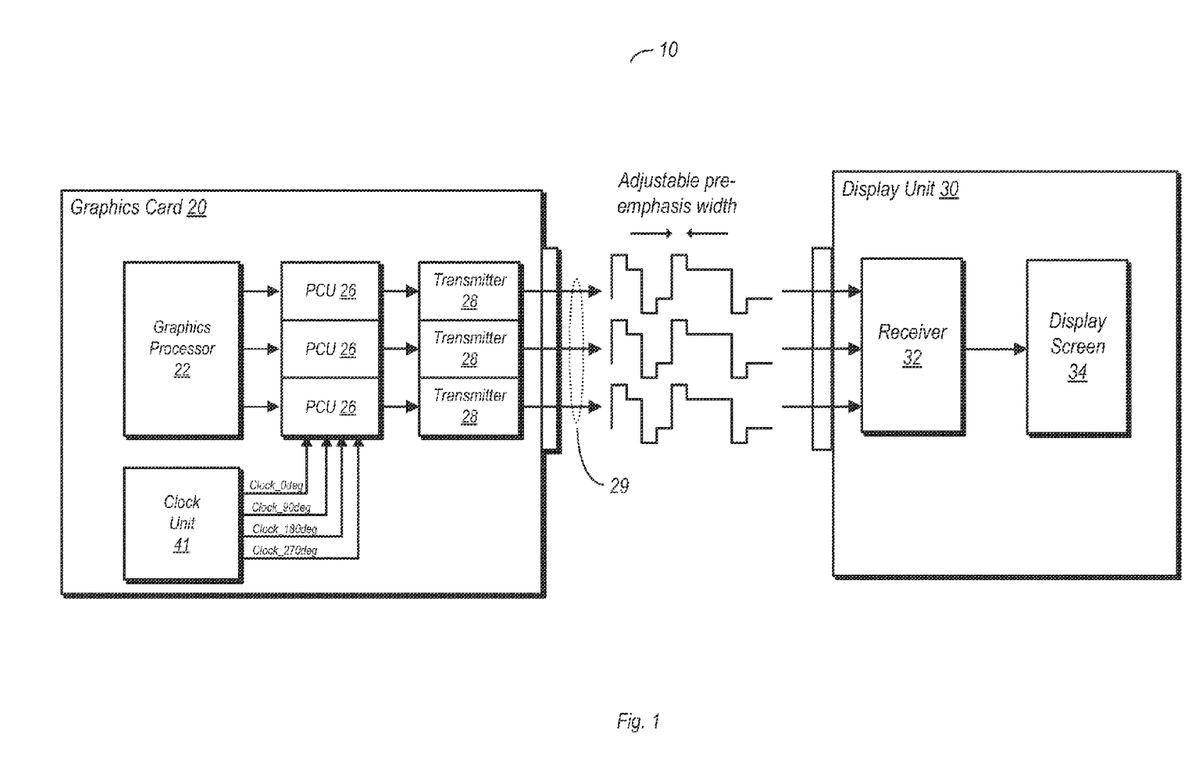
FIG. 1 is a block diagram of one embodiment of a graphics subsystem including a graphics card and a display unit.

Turning now to FIG. 1, a block diagram illustrating one embodiment of a graphics subsystem is shown. In the embodiment shown, graphic subsystem 10 may be implemented in a computer system, a gaming system, or any other type of electronic system in which a graphic subsystem may be included. Graphic subsystem 10 as shown in FIG. 1 includes a graphics card 20 that is coupled to a display unit 30 via a number of transmission lines (e.g., signal paths) 29. As used herein, the term 'transmission line' may refer to any type of signal path (e.g., wired, wireless, or optical) that may be used to implement a communications channel. In this particular embodiment, transmission lines 29 may implement three different channels via signal paths in a video cable.

Display unit 30 in the embodiment shown includes a receiver 32 and a display screen 34. Signals transmitted from graphics cared 20 may be received via transmission lines 29 at receiver 32. The received signals may then be translated into information that may be sent to display screen 34 in order to render graphics and/or text for display. Display unit 30 may implement one of many different types of displays. Such display types may include plasma displays, liquid crystal displays (LCDs), light emitting diode (LED) displays, cathode ray tube (CRT) displays, and so forth.

Graphics card 22 in the embodiment shown includes a graphics processor 22 that may generate graphics information based on data received from other portions of the system in which it is implemented. The graphics information generated by graphics processor 33 may then be forwarded to the pre-emphasis control units (PCU) 26. Each pre-emphasis control unit 26 may convert received data into a respective serial stream of digital data that may be transmitted on its respective channel. Furthermore, each PCU 26 may pre-emphasize certain transmitted signals, such as those associated with a logical transition (e.g., a logic 0 to logic 1 transition, where the logic 1 signal is pre-emphasized).

As will be explained below, the amount of time a particular signal may be pre-emphasized may depend on clock signals received by each PCU 26. In the embodiment shown, graphics card 20 includes a clock generator 41 configured to generate four different clock signals, each of which differs in phase with respect to the other clock signals. The generated clock signals include a 0° clock signal, a 90° clock signal, a 180° clock signal, and a 270° clock signals. Each PCU 26 in the embodiment shown may receive at least two of these clock signals. The phase difference between the two received clock signals may determine the amount of time (in terms of portion of a bit-time) that a transmitted signal may be pre-emphasized. In this embodiment, each PCU 26 is configured to pre-emphasize signal transmissions in which a logical transition occurs, while signal transmissions without a logical transition are not pre-emphasized.

Signals output from each PCU 26 may be received by a corresponding transmitter 28. Each transmitter 28 may transmit the signals, at their received voltage levels, onto its corresponding transmission line 29.

Pre-Emphasis Circuit

Figure 2:
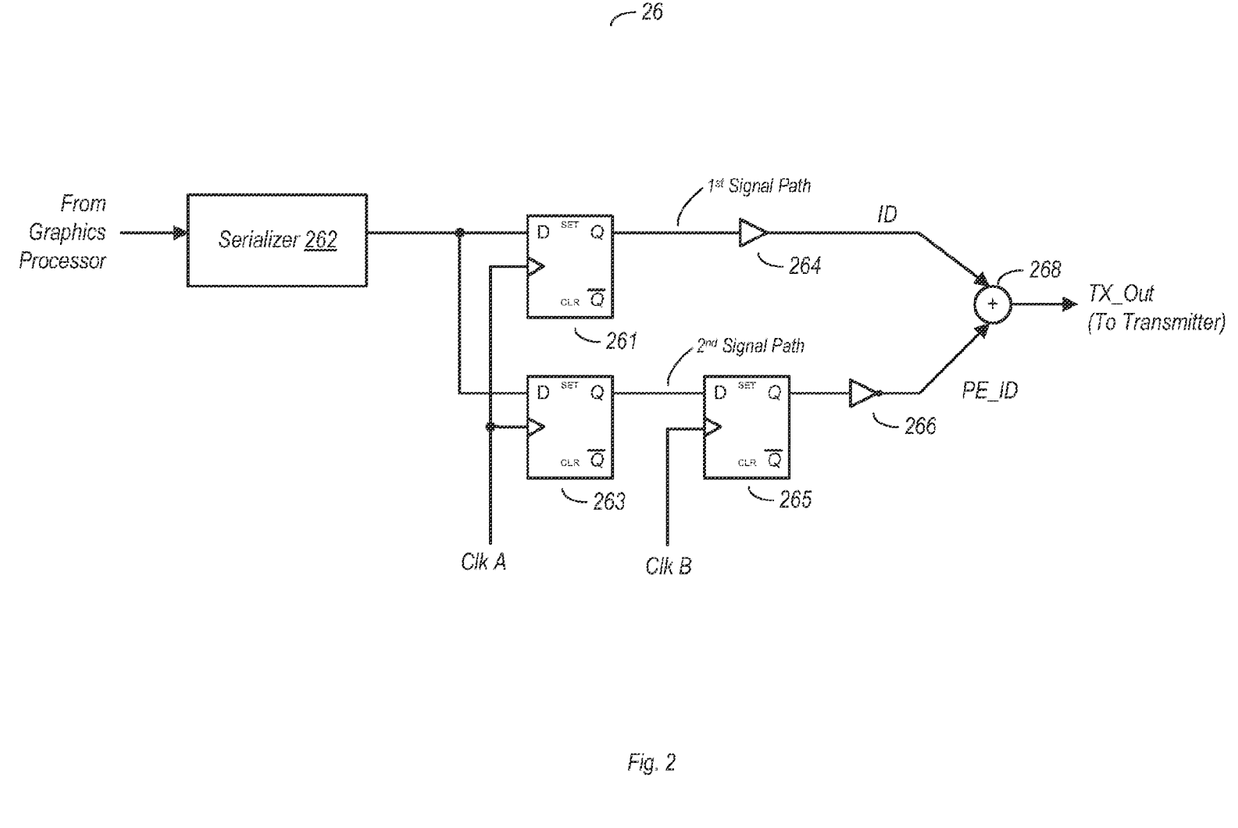
FIG. 2 is a block diagram of one embodiment of a pre-emphasis circuit.

FIG. 2 is a diagram illustrating one embodiment of a PCU 26. In the embodiment shown, PCU 26 includes a serializer configured to receive data from graphics processor 22. The data may be received in parallel transmissions, and may be converted into a serial stream of digital data that it output onto the first and second signal paths shown in the drawing. The first signal path may include a first flop circuit 261 and a buffer 264. The first flop circuit 261 in this example is a D-type flip-flop coupled to receive serially transmitted data signals from serializer 262 on its D-input. In addition, the first flop circuit 261 in this example is coupled to receive a first clock signal, ClkA.

A second signal path in the embodiment shown includes a second flop circuit 263 and a third flop circuit 265, which are also D-type flip-flops. The D-input of the second flop circuit 261 is coupled to the same node as the D-input of the first flop circuit 261. Furthermore, the second flop circuit 263 is also coupled to receive the same clock signal, ClkA. The D-input of the third flop circuit 265 is coupled to the Q-output of second flop circuit 263. Third flop circuit 265 is coupled to receive a second clock signal, ClkB, which differs in phase (but is equal in frequency) with respect to the first clock signal, ClkA. Accordingly, third flop circuit 265 may retime the first signal by effectively delaying it so that it is latched in accordance with the second clock signal. The first signal may be further retimed by inverter 266, which is coupled to the Q-output of third flop circuit 265. Inverter 266 may logically invert the received signal, effectively shifting its phase by 180°. Accordingly, a second signal may be produced in the second signal path by re-timing the first signal by synchronizing operation of the third flop circuit 265 to the second clock signal and subsequently inverting the output therefrom.

The first signal of original data (ID) and the second signal of pre-emphasis data (PE_ID) may each be received by summing circuit 268. In the embodiment shown, summing circuit 268 is configured to add the voltages of the two received signals to produce a third signal that is output to a respective transmitter 28. The third signal may be output at the same logic value (e.g., logic 0 or logic 1) as the first signal. Furthermore, the third signal may or may not be pre-emphasized for at least a portion of its bit time depending on a concurrent value of the second signal at the time they are added. Since the second signal is a retimed version of the first signal, their respective logic values may not always be the same. If the two logic values are the same at the time of adding, then the third signal may be output at a pre-emphasized voltage level. If the logic value of the first and second signals are complementary at the time of adding, the third signal may be output at a normal (i.e. non-pre-emphasized) voltage level, having the same logic value as the first signal. The portion of the bit-time of the third signal that is pre-emphasized may depend on the time at which the first and second signals have the same logic value. For example, if the first and second signals have the same logic value for ½ bit-time, then the third signal will be output at a pre-emphasized voltage for the first ½ bit-time and at a non-pre-emphasized voltage for the second ½ of the bit-time. Additional details of the pre-emphasis of signals by PCU 26 will be discussed below in conjunction with FIGS. 4 and 5.

As noted above, the third signal may be output from PCU 26 to a transmitter 28. In one embodiment, transmitter 28 may be a unity gain amplifier configured to output the received signal at the same voltage level as which it was received. Furthermore, even in embodiments in which transmitter 28 is not a unity gain amplifier, signals output therefrom may be pre-emphasized or not in accordance with the third signal received from summing circuit 268.

It is noted that while the illustrated embodiment performs the retiming operation using the third flop circuit 265 (operating according to the second clock signal) and the inverter 266, other embodiments are possible and contemplated. For example, delay circuits such as delay locked loops (DLLs) may be used to retime the first circuit to produce the second circuit. In general, any suitable circuitry may be used to produce a second signal that is added to the first signal to determine the voltage level of the signal conveyed to the transmitter.

Clock Distribution Apparatus

Figure 3:
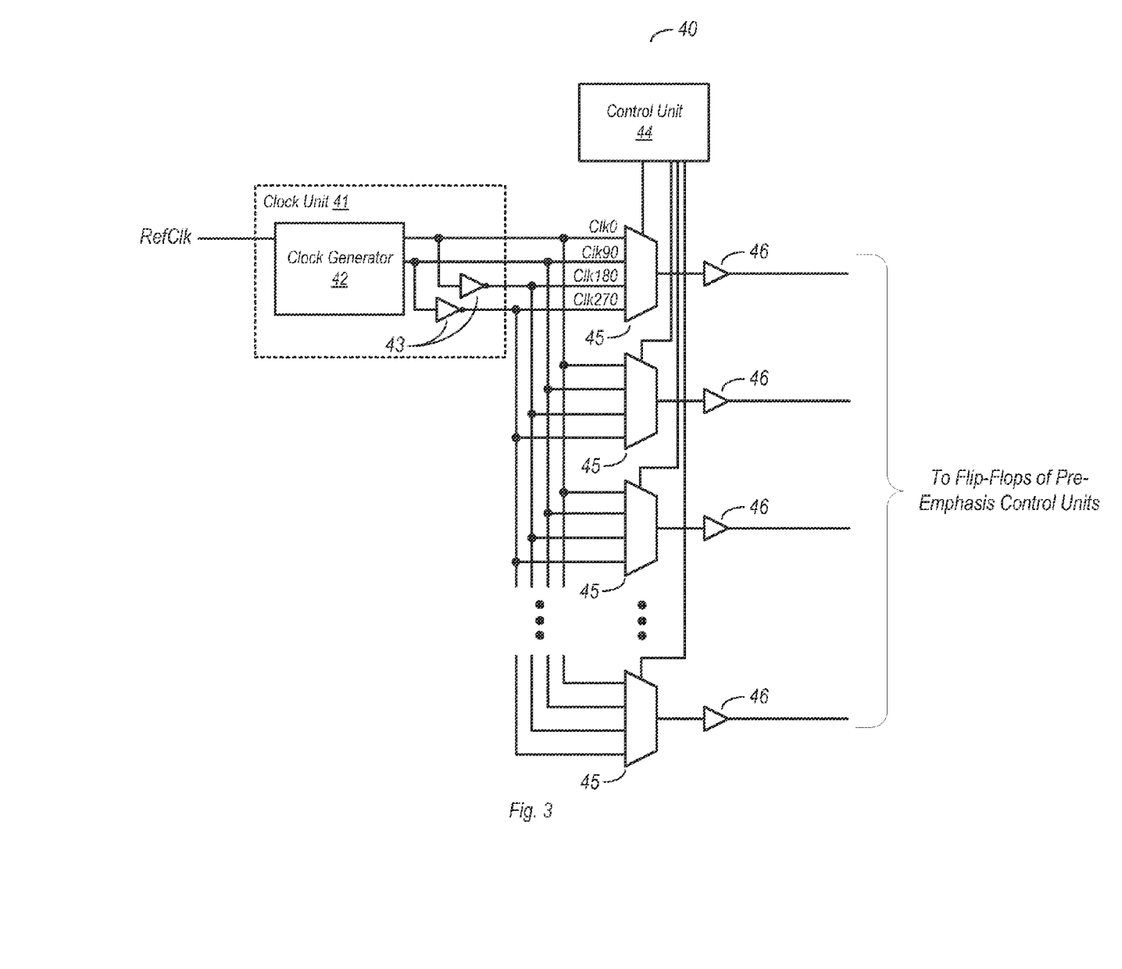
FIG. 3 is a block diagram of one embodiment of an apparatus for distributing clock signals to a pre-emphasis circuit.

FIG. 3 is a diagram illustrating one embodiment of a clock distribution apparatus used for providing clock signals to one or more pre-emphasis circuits. In the embodiment shown, clock distribution apparatus 40 includes a clock unit 41, a control unit 44, and a number of selection circuits 45. It is noted that some of the various components of clock distribution apparatus 40 may be implemented within other components of graphics subsystem 10. For example, selection circuits 45 may be implemented within particular instances of PCU 26, while control unit 44 may be implemented within graphics processor 22. Other embodiments may implement these components separately on graphics card 22. In general, the components of clock distribution apparatus may be implemented wherever suitable to perform their intended functions.

Clock unit 41 in the embodiment shown includes a clock generator 42, which is coupled to receive a reference clock signal. Based on the reference clock signal, clock generator 42 may produce two output clock signals, Clk0 and Clk90. These two clock signals may be equal in frequency, while Clk90 may lag (in terms of phase) Clk0 by 90°. Clock generator 42 may be implemented using various types of clock circuitry, including a phase locked loop (PLL), a delay locked loop (DLL), delay circuitry, and any other type of circuit capable of producing two clock signals having a desired phase difference with respect to one another. Clock signals Clk0 and Clk90 may be provided as output clock signals from clock unit 41.

In addition to Clk0 and Clk90, clock unit 41 in the embodiment shown is configured to output two additional clock signals, Clk180 and Clk270. In this embodiment, Clk180 may be produced by inverting Clk0 using a first one of inverters 43. As the name implies, Clk180 has a 180° phase difference with respect to Clk0. A second inverter 43 is coupled to receive Clk90 as an input in order to produce Clk270 as an output. As its name implies, Clk270 differs in phase from Clk0 by 270°.

It is noted that while clock unit 41 in the illustrated embodiment is arranged to output four clock signals differing in phase by 90° increments, other embodiments are possible and contemplated. For example, clock units configured to provide multiple clock signals differing in phase by 45° increments are also possible and contemplated.

Each of the clock signals output by clock unit 41 is provided to each of the selection units 45 in the embodiment shown. Selection units 45 are implemented here as multiplexers configured to select one of the input clock signals to be provided as an output. Each of the selection units 45 may be associated with a corresponding PCU 26, and may provide a selected clock signal thereto via a corresponding buffer 46. Since each PCU 26 is coupled to receive two different clock signals, there may be two selection units 45 associated with each PCU 26. The two selection units 45 associated with a given instance of PCU 26 may receive selection signals to cause two different clock signals to be provided. In one example, a first selection unit 45 may select Clk0 as a clock signal to be received by the first flop circuit 261 and the second flop circuit 263 of an instance of PCU 26, while a second selection unit may select Clk180 to be provided to the third flop circuit 265 of the same instance of PCU 26.

The selection of clock signals received by each instance of PCU 26 may be determined by control unit 44. Each selection unit 45 is coupled to receive selection signals from control unit 44. The selection signals received by any particular one of selection units 45 may be independent of those received by the other selection units 45. Accordingly, each selection unit 45 may be independently controlled by control unit 44. In some embodiments, control unit 44 may be implemented as firmware or static hardware, with the generated selection signals remaining unchanged during operation. In other embodiments, control unit 44 may be enabled to change the settings of the selection signals during operation.

Pre-Emphasis Levels and Timing

Figure 4:
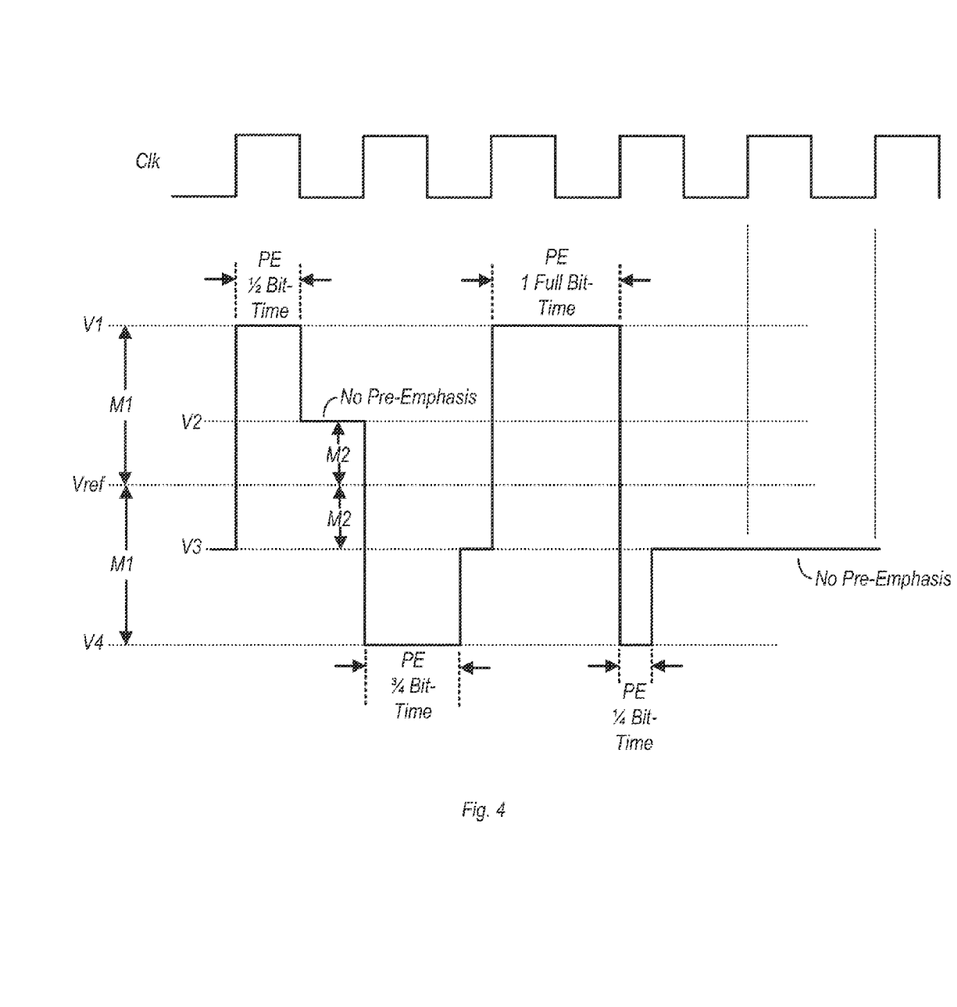
FIG. 4 is a diagram illustrating relative voltage levels and magnitudes for signals that are pre-emphasized and those that are not pre-emphasized for one embodiment of a pre-emphasis circuit.

FIG. 4 is a diagram illustrating the relative voltage levels and magnitudes for pre-emphasized signals and normal (i.e. non-pre-emphasized) signals. The example shown here illustrates the various voltage levels and magnitudes of pre-emphasized and non-pre-emphasized signals, as well as the amount of time (in terms of bit-width, relative to a clock signal) that signals may be pre-emphasized.

Signals may be transmitted at one of four different voltage levels and one of two different voltage magnitudes relative to a reference voltage. A pre-emphasized logic high signal may be transmitted at voltage level V1. A non-pre-emphasized logic high signal may be transmitted at voltage level V2, while a non-pre-emphasized logic low signal may be transmitted at voltage level V3. A pre-emphasized logic low signal may be transmitted at voltage level V4.

Pre-emphasized signals (both logic low and logic high) may be transmitted at a first voltage magnitude M1, which is referenced to a reference voltage, Vref. Non-pre-emphasized signals (both logic low and logic high) may be transmitted at a second voltage magnitude M2 relative to Vref. It is noted that Vref is shown in this example to illustrate the difference in voltage magnitude between pre-emphasized and non-pre-emphasized signals. Thus, Vref may be a voltage that is an average voltage between a logic low voltage and a logic high voltage for equivalently emphasized signals. For example, if a pre-emphasized logic high voltage (V1) is 1.0 volt and a pre-emphasized logic low voltage is 0 volts (V2), Vref may be 0.5 volts, and M1 may also be 0.5 volts. For the same example, if a non-pre-emphasized logic high voltage is 0.75 volts, and a non-pre-emphasized logic low voltage is 0.25 volts, Vref is also 0.5 volts, while M1 is 0.25 volts.

For signals that are pre-emphasized, the amount of time of the actual pre-emphasis may be variable. In particular, the amount of time, measured in terms of bit-time (see definition provide above) may be dependent on the amount of time both the original data signal and the retimed signal are logically equivalent (e.g., both logic 1's). Recall that in the apparatus of FIG. 2, a first signal (the original data signal) and a second signal (a retimed version of the data signal) may be provided to a summing circuit that may add their respective voltage levels together. The resultant data signal, transmitted at the same logic value as the original data signal, may be a pre-emphasized signal (e.g., a logic 1 transmitted at V1) when the original signal and the retimed signal are logically equivalent. The resultant data signal may be transmitted at a normal voltage level (e.g., a logic 1 transmitted at V2) when the original signal and the retimed signal are not logically equivalent.

The amount of time the original signal and the retimed signal are logically equivalent for a PCU 26 may depend upon at least a phase difference between the first and second clock signals received by its respective flop circuits. As previously noted, flop circuits 261 (in the first signal path) and 263 (in the second signal path) are both coupled to receive a first clock signal. Flop circuit 265 (in the second path and coupled to receive the output of flop circuit 263) is coupled to receive a second clock signal having a phase difference with respect to the first clock signal. Accordingly, the amount of time that the first and second signals provided to summing circuit 268 are logically equivalent may be dependent on the phase difference between the first and second clock signals. In the embodiment discussed herein, the phase difference between the first and second clock signals may be set to allow a signal to be pre-emphasized (transmitted at the first magnitude) for ¼ bit-time, ½ bit-time, ¾ bit-time, or for a full-bit-time. For the remainder of a bit-time that a signal is not pre-emphasized, it is transmitted at the second magnitude.

FIG. 4 shows a signal first being transmitted as a pre-emphasized logic high (V1, M1) for ½ bit-time, which corresponds to one half of a clock cycle in this example. For the ½ bit-time, the signal is transmitted as a logic high at the normal voltage level and magnitude (V2, M2). The next signal, a logic low, is transmitted as a pre-emphasized logic low (V4, M1) for ¾ bit-time and as a non-pre-emphasized logic low (V3, M2) for the remaining ¼ bit time. The signal following the logic low is a logic high that is pre-emphasized for a full bit-time. The next signal is a logic low transmitted as pre-emphasized for ¼ bit-time, and non-pre-emphasized for the remaining ¾ bit-time. Following this logic low, another logic low is transmitted as a non-pre-emphasized signal, since no logical transition occurred from the previous signal.

It is noted that while FIG. 4 implies that amount of time a signal may be pre-emphasized may be dynamically varied during operation in the illustrated example, other embodiments are possible and contemplated. More particularly, embodiments wherein a pre-emphasis time is preselected and remains static during operation are possible and contemplated. Furthermore, it is noted that the various pre-emphasis times (e.g., ¼ bit-time, ½ bit-time, etc.) shown here are exemplary, but embodiments using other pre-emphasis times (e.g., ⅜ bit-time) are also possible and contemplated.

Figure 5:
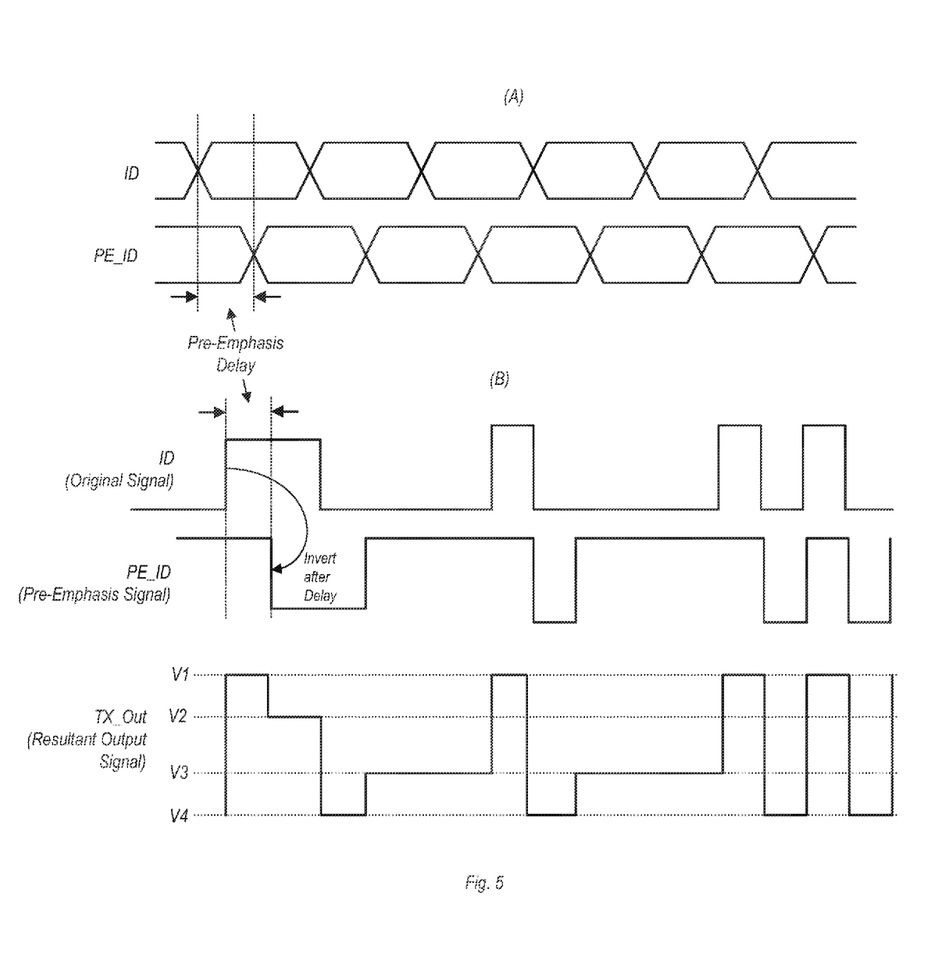
FIG. 5 is a pair of timing diagrams illustrating the pre-emphasis of signals produced by one embodiment of a pre-emphasis circuit.

Turning now to FIG. 5, a pair of timing diagrams further illustrating the pre-emphasis operation is shown. Timing diagram (A) illustrates the delaying of a first signal in order to produce the second signal. In the illustrated example, ID is the original data that is conveyed to a first input of summing circuit 268 via the first signal path. The second signal, PE_ID, is produced at least partly based on delaying the original data by a pre-emphasis delay value. Furthermore, the delayed signal may also be inverted, as shown in timing diagram (B).

In timing diagram (B) it can be seen that when both the original signal (ID) and the pre-emphasis signal (PE_ID) are both at the same logic value, the resulting signal (TX_Out) is pre-emphasized. The amount of time the resulting signal is pre-emphasized is a function of the amount of pre-emphasis delay that is provided. For example, at the left-hand side of the drawing, the original signal and the pre-emphasis signal are both at the same logic level for a time equal to the pre-emphasis delay, and thus the resulting signal is transmitted a pre-emphasized voltage level V1. After an amount of time equal to the delay has elapsed, the pre-emphasis signal is inverted, while the logic value of the original signal remains the same. Subsequent to inverting the pre-emphasis signal in this example, the original signal continues to be conveyed at the same logic value. However, since the pre-emphasis signal is of a different logic value with respect to the original signal, the resulting output signal is transmitted at a non-pre-emphasized voltage, V2.

A similar pattern occurs with logic low transmissions. When both the original signal and the pre-emphasis signal are transmitted as logic lows, the resulting output signal is transmitted at the pre-emphasized voltage of V4. When the original data signal is a logic low but the pre-emphasis signal is a logic high, the resulting output signal is a logic low transmitted at the non-pre-emphasized voltage level V3.

Thus, pre-emphasis is accomplished in the illustrated embodiment by delaying the original data signal to produce the pre-emphasis signal, and then adding their respective voltages together. The termination of pre-emphasis for any single signal transmission in the illustrated example is accomplished by inverting the pre-emphasis signal after the delay time has elapsed. Since the pre-emphasis signal lags the original data signal by the delay time, logical transitions include pre-emphasis for at least a portion of their respective bit-times, with the portion being dependent upon the delay time. Since the pre-emphasis signal is inverted after the delay time has elapsed, subsequent signal transmissions at the same logic value (i.e. no logical transition from one bit to the next) are not pre-emphasized.

Method Flow Diagram

Figure 6:
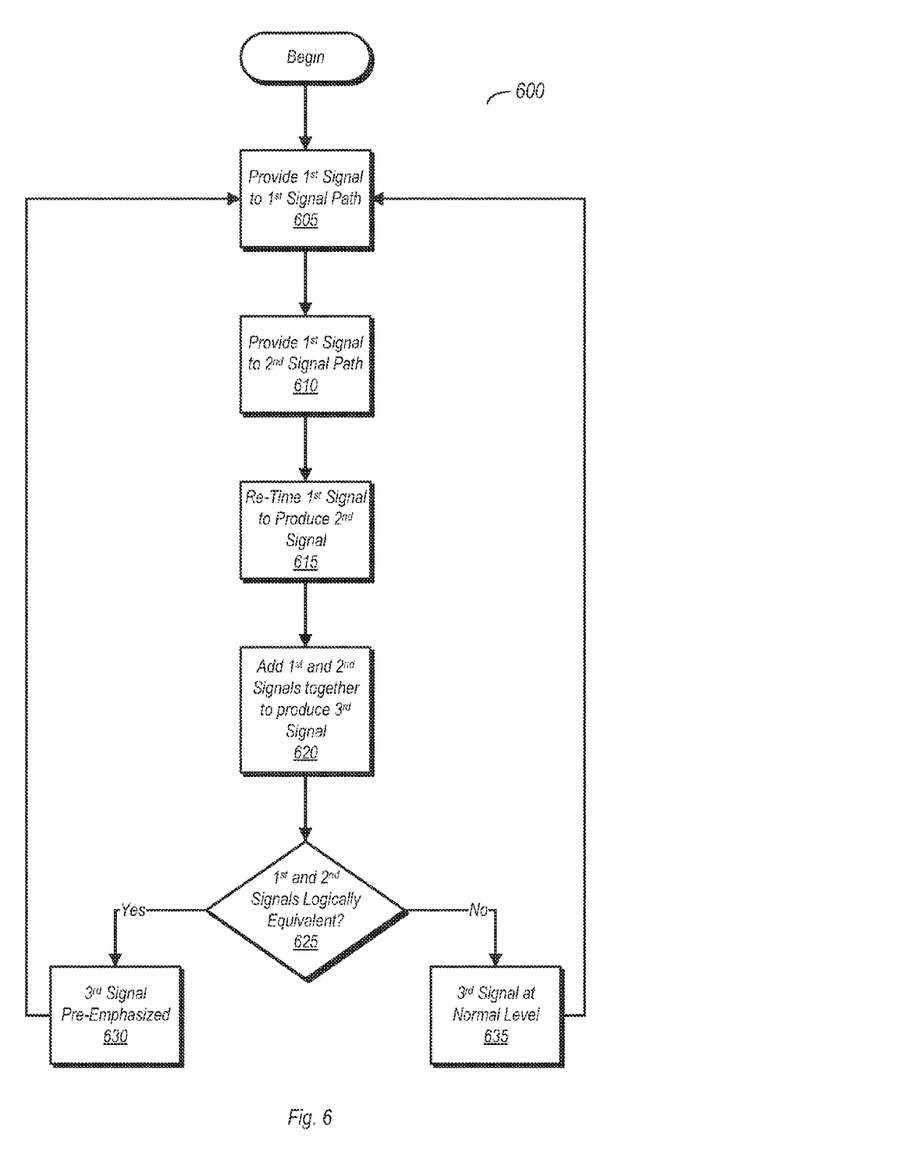
FIG. 6 is a flow diagram illustrating one embodiment of a method for pre-emphasizing signals.

FIG. 6 is a flow diagram of one embodiment of a method for pre-emphasizing signals. Method 600 begins with the providing a first data signal to a first signal path (block 605). The first data signal may be one bit of a serial stream of bits transmitted in a communications channel. The first data signal may also be provided to a second signal path (block 610). In the second signal path, the first data signal may be retimed to produce a second data signal (block 615). Re-timing the first data signal to produce the second data signal may include delaying the first data signal, e.g., by synchronizing it to a clock signal that is delayed with respect to the clock signal to which the first signal is synchronized to in the first signal path. Re-timing may further include inverting the delayed signal. The first data signal and the second data signal may then be provided to a summing circuit which adds their respective voltage levels to produce a third signal (block 620). If the first and second data signals are logically equivalent (e.g., both logic 1's) at the time their respective voltages are added (block 625, yes), the resulting third signal is a pre-emphasized version of the first signal (block 630). If the first and second signals are not logically equivalent at the time their respective voltages are added (block 625, no), the third signal may be transmitted at a normal (i.e. non-pre-emphasized) voltage level. In either case, method 600 then returns to block 605 for the next bit to be transmitted.

Carrier Medium

Figure 7:
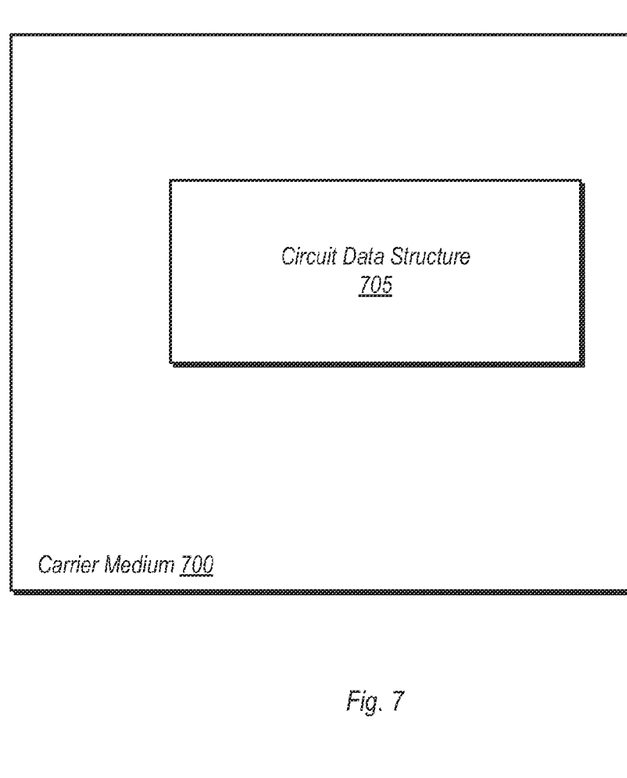
FIG. 7 is a block diagram of one embodiment of a carrier medium.

Turning next to FIG. 7, a block diagram of a computer accessible storage medium 700 including a database 705 representative of system 10 and/or various components thereof is shown. Generally speaking, a computer accessible storage medium 700 may include any non-transitory storage media accessible by a computer during use to provide instructions and/or data to the computer. For example, a computer accessible storage medium 700 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the data 705 representative of the system 10 and/or portions thereof carried on the computer accessible storage medium 700 may be a database or other data structure which can be read by a program and used, directly or indirectly, to fabricate the hardware comprising the system 10. For example, the database 705 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 10. The netlist may then be placed and routed to produce a data set describing geometric shapes to be applied to masks. The masks may then be used in various semiconductor fabrication steps to produce a semiconductor circuit or circuits corresponding to the system 10. Alternatively, the database 705 on the computer accessible storage medium 700 may be the netlist (with or without the synthesis library) or the data set, as desired, or Graphic Data System (GDS) II data.

While the computer accessible storage medium 700 carries a representation of the system 10, other embodiments may carry a representation of any portion of the system 10, as desired, including PCU 26, any set of agents (e.g., graphics processor 22, clock unit 41, PCU 26, etc.) or portions of agents.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
a re-timing circuit configured to retime a first signal by a predetermined amount to produce a second signal; and
a summing circuit configured to add the second signal to the first signal to produce a third signal, wherein the third signal is logically equivalent to the first signal, and wherein the third signal is pre-emphasized to a first magnitude for a duration equal to a first portion of a bit-time of the first signal, and wherein the third signal is not pre-emphasized and has a second magnitude for a duration equal to a second portion of the bit-time of the first signal, wherein the bit-time of the first signal comprises a duration of approximately one full period of a first clock signal, and wherein the first and second portions of the bit-time of the first signal are each less than one full period of the clock signal, and wherein a sum of the first and second portions of the bit-time is equal to one full period of the clock signal.

2. The circuit as recited in claim 1, wherein the first magnitude is greater than the second magnitude.

3. The circuit as recited in claim 1, wherein the first portion is one of the following:
one-quarter bit-time;
one-half bit-time;
three-quarters bit-time; and
wherein the second portion is one of the following:
three-quarters bit-time when the first portion is one-quarter bit-time;
one-half-bit time when the first portion is one-half bit-time;
one-quarter bit-time when the first portion is three-quarters bit-time.

4. The circuit as recited in claim 1, wherein the circuit is further configured to receive a fourth signal subsequent to receiving the first signal, wherein a second signal path is configured to produce a fifth signal, and wherein the summing circuit is configured to add the fifth signal to the fourth signal to produce a sixth signal, wherein the sixth signal has a magnitude that remains substantially unchanged for a full bit-time.

5. The circuit as recited in claim 1, wherein a first signal path of the circuit includes a first flop coupled to receive the first clock signal, wherein a second signal path of the circuit includes a second flop and a third flop, wherein the second flop is coupled to receive the first clock signal, and wherein the third flop is coupled to receive a second clock signal, wherein the first and second clock signals have a phase difference with respect to one another.

6. The circuit as recited in claim 5, wherein the first signal path includes a buffer coupled between an output of the first flop and a first input of the summing circuit, and wherein the second signal path includes an inverter coupled between an output of the third flop and a second input of the summing circuit.

7. The circuit as recited in claim 5, further comprising a clock unit, wherein the clock unit includes a clock generator configured to generate a plurality of clock signals and wherein the first, second, and third flops are each associated with a corresponding one of a plurality of selection circuits coupled to receive the plurality of clock signals, wherein each of the plurality of selection circuits is configured to select one of the plurality of clock signals to be provided as a respective output clock signal.

8. The circuit as recited in claim 7, wherein the first and second flops are coupled to receive the first clock signal from a first one of the plurality of selection circuits, and wherein the third flop is coupled to receive the second clock signal from a second one of the plurality of selection circuits.

9. The circuit as recited in claim 7, wherein the plurality of clock signals includes:
a third clock signal;
a fourth clock signal having a 90° phase difference with respect to the third clock signal;
a fifth clock signal having a 180° phase difference with respect to the third clock signal; and
a sixth clock signal having a 270° phase difference with respect to the third clock signal.

10. The circuit as recited in claim 9, wherein the first clock signal is produced based on one of the third, fourth, fifth, and sixth clock signal, and wherein the second clock signal is produced based on a different one of the third, fourth, fifth, and sixth clock signals.

11. The circuit as recited in claim 1, further comprising a serializer coupled to provide the first signal to first and second signal paths, wherein the serializer is configured to generate a serial stream of bits.

12. A method comprising:
retiming a first signal, by a predetermined amount, in order to generate a second signal;
adding the first signal and the second signal to produce a third signal, wherein the third signal is logically equivalent to the first signal, and wherein the third signal is pre-emphasized to a first magnitude for a duration equal to a first portion of a bit-time of the first signal, and wherein the third signal is not pre-emphasized and has a second magnitude for a duration equal to a second portion of the bit-time of the first signal, wherein the bit-time of the first signal comprises a duration of approximately one full period of a first clock signal, and wherein the first and second portions of the bit-time of the first signal are each less than one full period of the clock signal, and wherein the first and second portions of the bit-time combined are equal to one full period of the first clock signal.

13. The method as recited in claim 12, wherein the first magnitude is greater than the second magnitude, and wherein the first portion precedes the second portion.

14. The method as recited in claim 12, wherein the first portion is one of the following:
one-quarter bit-time;
one-half bit-time;
three-quarters bit-time; and
wherein the second portion is one of the following:
three-quarters bit-time when the first portion is one-quarter bit-time;
one-half-bit time when the first portion is one-half bit-time;
one-quarter bit-time when the first portion is three-quarters bit-time.

15. The method as recited in claim 12, further comprising:
a first signal path receiving a fourth signal subsequent to receiving the first signal;
generating a fifth signal in a second signal path;
adding the fifth signal to the fourth signal to produce a sixth signal, wherein the sixth signal has a magnitude that remains unchanged for a full bit-time.

16. The method as recited in claim 12, further comprising:
a first flop in a first signal path receiving the first clock signal;
a second flop in a second signal path receiving the first clock signal;
a third flop in the second signal path receiving a second clock signal, wherein the first and second clock signals have a phase difference with respect to one another; and
the third flop retiming the first signal to produce the second signal.

17. The method as recited in claim 16, further comprising:
a clock generator generating a plurality of clock signals;
a plurality of selection circuits receiving each of the plurality of clock signals;
each of the plurality of selection circuits selecting one of the plurality of clock signals to be provided as a respective output clock signal.

18. The method as recited in claim 17, further comprising:
the first and second flops receiving the first clock signal from one of the plurality of selection circuits; and
the third flop receiving the second clock signal from a different one of the plurality of selection circuits.

19. The method as recited in claim 17, wherein the plurality of clock signals includes:
a third clock signal;
a fourth clock signal having a 90° phase shift with respect to the third clock signal;
a fifth clock signal having a 180° phase shift with respect to the third clock signal; and
a sixth clock signal having a 270° phase shift with respect to the third clock signal.

20. The method as recited in claim 19, further comprising:
generating the first clock signal based on one of the third, fourth, fifth, and sixth clock signals; and
generating the second clock signal based on a different one of the third, fourth, fifth, and sixth clock signals.

21. The method as recited in claim 16, further comprising:
the summing circuit receiving the first signal from a buffer, wherein the buffer is coupled to receive the first signal from the first flop; and
the summing circuit receiving the second signal from an inverter, wherein an input of the inverter is coupled to an output of the third flop.

22. The method as recited in claim 12, further comprising a serializer providing the first signal to first and second signal paths, wherein the serializer is configured to generate a serial stream of bits.

23. A system comprising:
a graphics unit, wherein the graphics unit is configured to provide graphics data to a display unit over a plurality of channels, wherein each of the plurality of channels is associated with a respective one of a plurality of pre-emphasis units, and wherein at least one of the plurality of pre-emphasis units comprises:
a re-timing circuit configured to retime a respective first signal by a predetermined amount to produce a respective second signal; and
a summing circuit coupled to receive the respective first signal configured to add the second signal to the respective first signal to produce a respective third signal, wherein the respective third signal is logically equivalent to the respective first signal, and wherein the respective third signal is pre-emphasized to a first magnitude for a duration equal to a first portion of a bit-time of the first signal, and wherein the third signal is not pre-emphasized and has a second magnitude for a duration equal to a second portion of the bit-time of the respective first signal, wherein the bit-time of the first signal comprises a duration of approximately one full period of a first clock signal, and wherein the first and second portions of the bit-time of the first signal are each less than one full period of the clock signal, and wherein the first and second portions of the bit-time combined are equal to one full period of the first clock signal.

24. The system as recited in claim 23, wherein the first magnitude is greater than the second magnitude.

25. The system as recited in claim 23, wherein the first portion is one of the following:
   one-quarter bit-time;
   one-half bit-time;
   three-quarters bit-time; and
   wherein the second portion is one of the following:
   three-quarters bit-time when the first portion is one-quarter bit-time;
   one-half-bit time when the first portion is one-half bit-time;
   one-quarter bit-time when the first portion is three-quarters bit-time.

26. The system as recited in claim 23, wherein a respective first signal path of each of the plurality of pre-emphasis units includes a respective first flop coupled to receive the first clock signal, wherein a respective second signal path of each of the plurality of pre-emphasis units includes a respective second flop and a respective third flop, wherein the respective second flop is coupled to receive the first clock signal, and wherein the respective third flop is coupled to receive a second clock signal, wherein the first and second clock signals have a phase difference with respect to one another.

27. The system as recited in claim 26, wherein the graphics unit further comprises:
   a clock unit, wherein the clock unit includes a clock generator configured to generate a plurality of clock signals and wherein the first, second, and third flops are each associated with a corresponding one of a plurality of selection circuits coupled to receive the plurality of clock signals, wherein each of the plurality of selection circuits is configured to select one of the plurality of clock signals to be provided as a respective output clock signal;
   wherein the respective first and second flops of each of the plurality of pre-emphasis units are coupled to receive the first clock signal from a corresponding first one of the plurality of selection circuits, and wherein the respective third flop of each of the plurality of pre-emphasis units is coupled to receive the second clock signal from a corresponding second one of the plurality of selection circuits.

28. The system as recited in claim 27, wherein the plurality of clock signals includes:
   a third clock signal;
   a fourth clock signal having a 90° phase shift with respect to the third clock signal;
   a fifth clock signal having a 180° phase shift with respect to the third clock signal; and
   a sixth clock signal having a 270° phase shift with respect to the third clock signal;
   wherein the first clock signal is produced based on one of the third, fourth, fifth, and sixth clock signal, and wherein the second clock signal is produced based on a different one of the third, fourth, fifth, and sixth clock signals.

29. A non-transitory computer readable medium comprising a data structure which is operated upon by a program executable on a computer system, the program operating on the data structure to perform a portion of a process to fabricate an integrated circuit including circuitry described by the data structure, the circuitry described in the data structure comprising:
   a re-timing unit configured to retime the first signal by a predetermined amount to produce a second signal;
   a summing circuit coupled to receive the first signal from a first signal path and the second signal from a second signal path, wherein the summing circuit is configured to add the second signal to the first signal to produce a third signal, wherein the third signal is logically equivalent to the first signal, and wherein the third signal is pre-emphasized to a first magnitude for a duration equal to a first portion of a bit-time of the first signal, and wherein the third signal is not pre-emphasized and has a second magnitude for a duration equal to a second portion of the bit-time of the first signal, wherein the first magnitude is greater than the second magnitude, and wherein the first portion precedes the second portion, wherein the bit-time of the first signal comprises a duration of approximately one full period of a first clock signal, and wherein the first and second portions of the bit-time of the first signal are each less than one full period of the clock signal, and wherein the first and second portions of the bit time combined are equal to one full period of the first clock signal.

30. The computer readable medium as recited in claim 29, wherein the data structure comprises one or more of the following types of data:
   HDL (high-level design language) data;
   RTL (register transfer level) data;
   Graphic Data System (GDS) II data.

* * * * *